US012622251B2

(12) United States Patent
Yeh et al.

(10) Patent No.: US 12,622,251 B2
(45) Date of Patent: May 5, 2026

(54) VIA CONNECTION STRUCTURE HAVING MULTIPLE VIA TO VIA CONNECTIONS

(71) Applicant: Taiwan Semiconductor Manufacturing Company, Ltd., Hsinchu (TW)

(72) Inventors: Ting-Yu Yeh, Hsinchu (TW); Shu-Cheng Li, Hsinchu (TW); Chun-Hsien Wen, Taoyuan County (TW); Chih-Wei Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 676 days.

(21) Appl. No.: 17/825,336

(22) Filed: May 26, 2022

(65) Prior Publication Data

US 2023/0386969 A1 Nov. 30, 2023

(51) Int. Cl.
| | |
|---|---|
| *H01L 23/48* | (2006.01) |
| *H01L 21/48* | (2006.01) |
| *H01L 23/522* | (2006.01) |
| *H01L 23/528* | (2006.01) |

(52) U.S. Cl.
CPC ........ *H01L 23/481* (2013.01); *H01L 21/4853* (2013.01); *H01L 23/5226* (2013.01); *H01L 23/528* (2013.01)

(58) Field of Classification Search
CPC .............. H01L 23/5226; H01L 23/528; H01L 23/5386; H01L 23/5384; H01L 23/5383; H01L 21/4857; H01L 21/486
See application file for complete search history.

(56) References Cited

U.S. PATENT DOCUMENTS

| | | | |
|---|---|---|---|
| 2015/0028471 A1* | 1/2015 | Lin ......................... | H01L 24/96 257/737 |
| 2015/0214293 A1* | 7/2015 | Liao .................... | H01L 23/5329 257/532 |
| 2016/0181189 A1* | 6/2016 | Qian ................. | H01L 23/49816 174/264 |
| 2017/0018478 A1* | 1/2017 | Maple .................... | H10D 30/47 |
| 2017/0018501 A1* | 1/2017 | Maple .................... | H10D 62/85 |
| 2018/0168039 A1* | 6/2018 | Numagi ........... | H01L 23/49838 |
| 2019/0198518 A1* | 6/2019 | Lomeli ................. | H10B 43/35 |
| 2020/0286745 A1* | 9/2020 | Elsherbini ........... | H01L 21/4857 |
| 2021/0351122 A1* | 11/2021 | Kim .................... | H01L 23/5283 |
| 2023/0187332 A1* | 6/2023 | Hung ............... | H01L 23/49838 257/668 |
| 2023/0317588 A1* | 10/2023 | Sun ................... | H01L 23/49827 |

* cited by examiner

*Primary Examiner* — Kevin Parendo
(74) *Attorney, Agent, or Firm* — Foley & Lardner LLP

(57) ABSTRACT

Connection structures and methods of manufacture in which a conductive structure is disposed between, and in electrical contact with, pluralities of via structures. Each via structure is laterally offset from adjacent via structures to avoid stacked vias, and each via is electrically connected to at least two additional vias on a level of a semiconductor device, through conductive traces and footprints of the connection structure.

18 Claims, 11 Drawing Sheets

| Concentric | 1 | 2 | 3 | 4 | 5 |
|---|---|---|---|---|---|
| Via num | 1 | 7 | 19 | 37 | 61 |
| Metal area | 170 | 1800 | 5000 | 10000 | 17000 |
| Metal density | 1% | 10.5% | 30% | 59.3% | 98.6% |
| Via / metal | 90% | 70% | 58% | 57% | 56% |

FIG. 7d
FIG. 7e
FIG. 7f
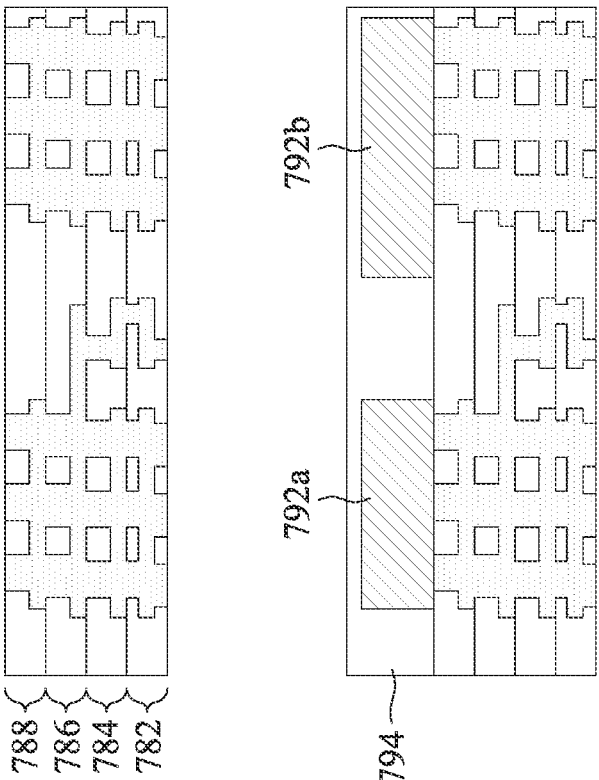
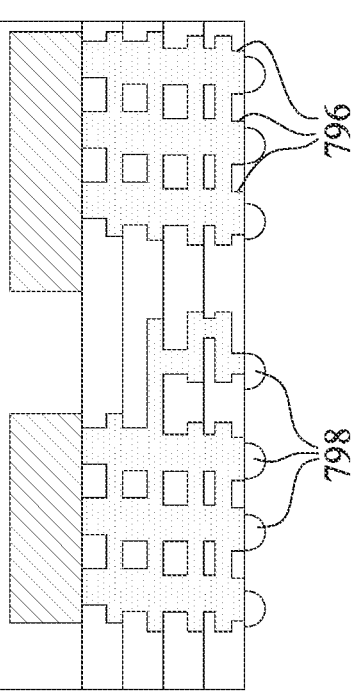

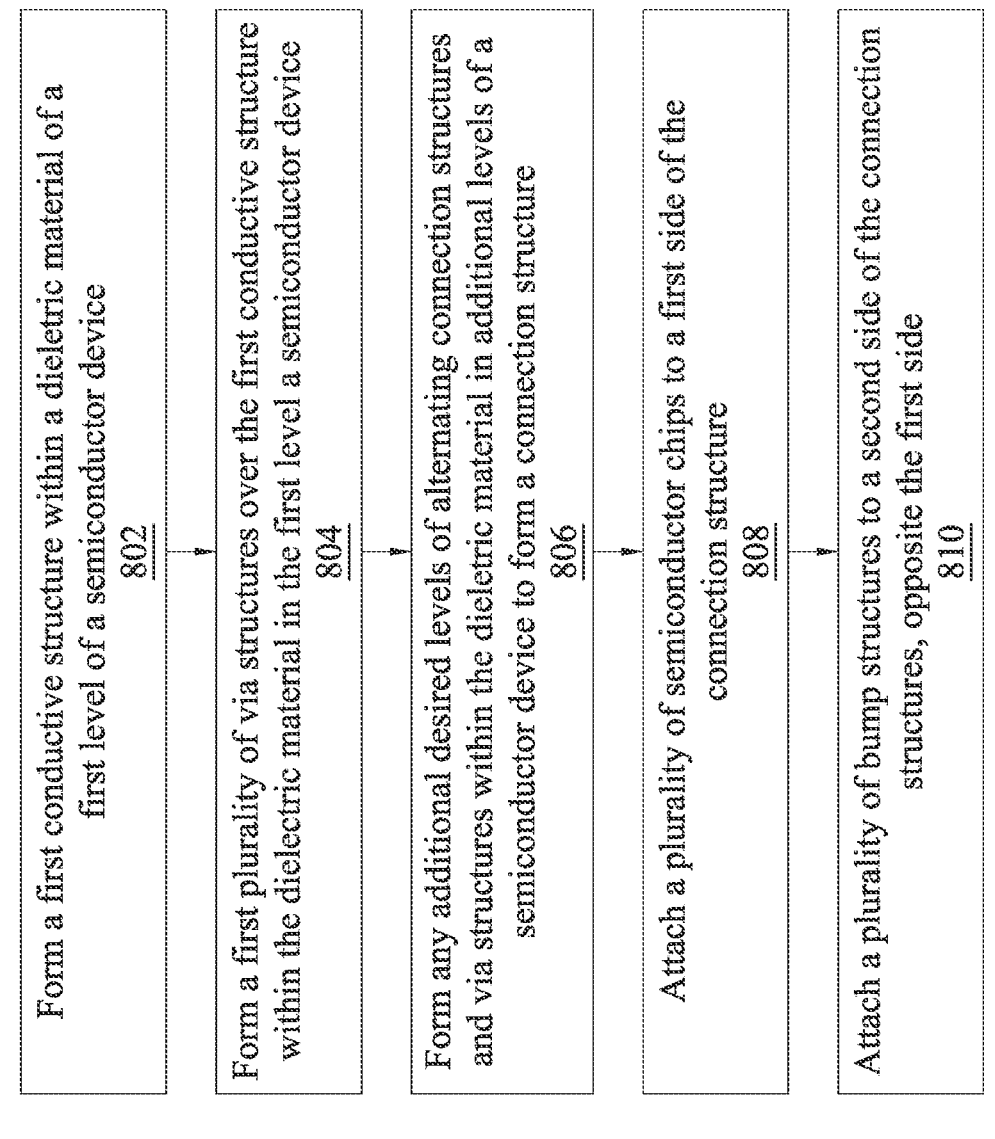

800

Form a first conductive structure within a dieletric material of a
first level of a semiconductor device
802

Form a first plurality of via structures over the first conductive structure
within the dielectric material in the first level a semiconductor device
804

Form any additional desired levels of alternating connection structures
and via structures within the dielectric material in additional levels of a
semiconductor device to form a connection structure
806

Attach a plurality of semiconductor chips to a first side of the
connection structure
808

Attach a plurality of bump structures to a second side of the connection
structures, opposite the first side
810

FIG. 8

VIA CONNECTION STRUCTURE HAVING MULTIPLE VIA TO VIA CONNECTIONS

BACKGROUND

Semiconductor devices are ubiquitous in several applications and devices throughout various industries. For example, consumer electronics devices such as personal computers, cellular telephones, and wearable devices may contain several semiconductor devices. Similarly, industrial products such as instruments, vehicles, and automation systems frequently comprise a large number of semiconductor devices. As semiconductor manufacturing improves, semiconductors continue to be used in new applications which, in turn, leads to increasing demands of semiconductor performance, cost, reliability, etc.

These semiconductor devices are fabricated by a combination of front-end-of-line (FEOL) processes and back-end-of-line (BEOL) processes, which connect one or more semiconductor (e.g., silicon) dies to each other and package them into a semiconductor device that can interface with other devices. For example, the package may combine a plurality of semiconductor dies and can be configured to be attached to a printed circuit board or other interconnected substrate, which may, in turn, increase the thermal and connection density of a semiconductor device.

Many BEOL operations comprise processing a semiconductor or related device by alternatively depositing and etching levels of the device, one disposed over the other. Processes may interconnect levels by a redistribution structures, vias, bonding wires, etc. in order to propagate signals within a semiconductor device, and between a semiconductor device and a substrate, connections (e.g., electrical, thermal, mechanical, etc.) are formed between levels of semiconductor devices. While existing approaches use sophisticated techniques, further improvements are needed to advance the state of the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a selection matrix for patterns of various numbers of concentric hexagons.

Figures 5B, 5C, 5D, 5E, 5F, 5G, 5H:
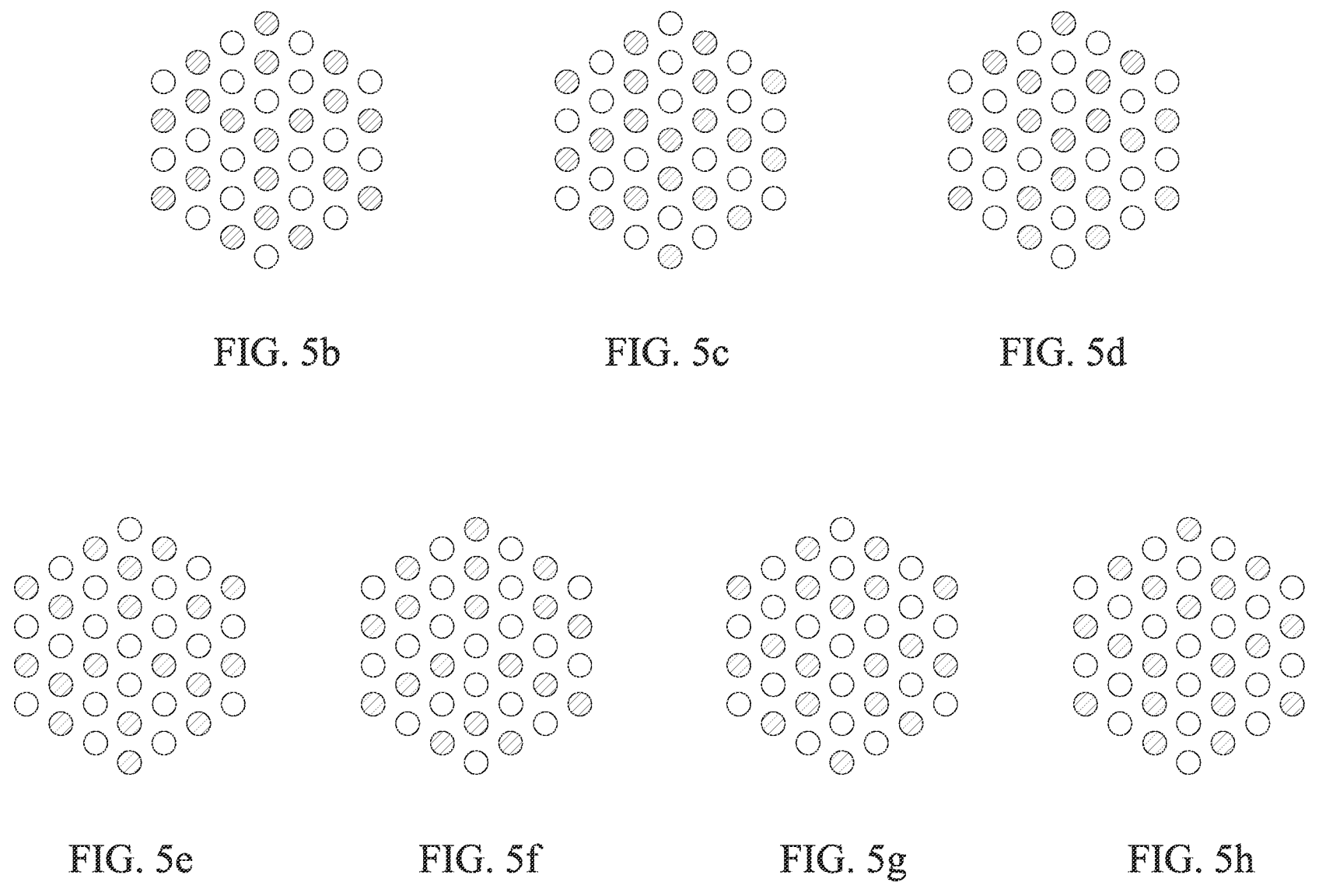

FIGS. 5a, 5b, 5c, 5d, 5e, 5f, 5g, and 5h illustrate a plurality of patterns for a concentric hexagonal connection structure having four concentric hexagons, in accordance with some embodiments.

FIGS. 7a, 7b, 7c, 7d, 7e, and 7f illustrate cross sectional views of intermediate stages in the formation of a connection structure, in accordance with some embodiments.

FIG. 8 includes a flowchart of an example method of fabricating a semiconductor device, in accordance with some embodiments.

DETAILED DESCRIPTION

Figure 1:
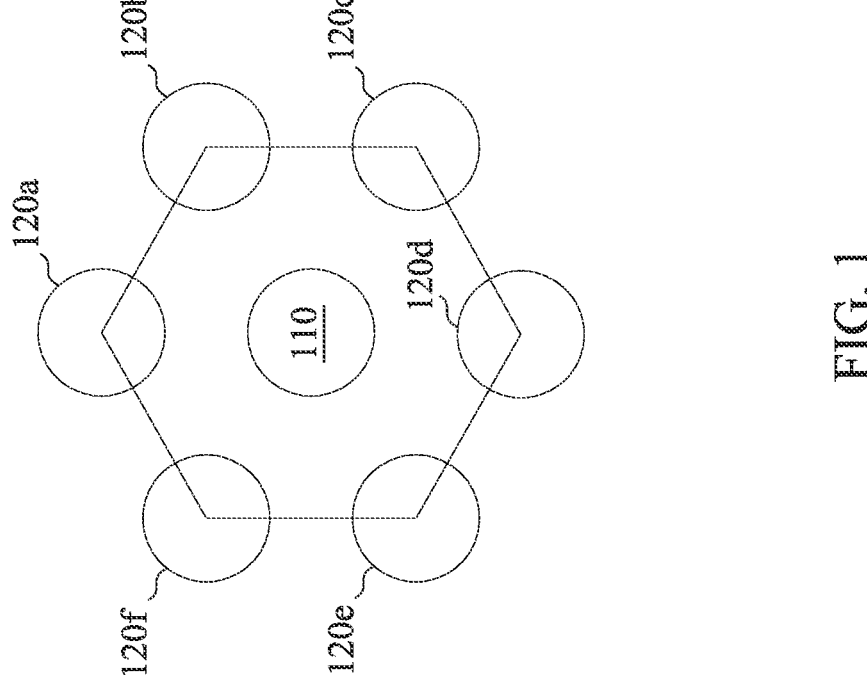
FIG. 1 illustrates a hexagonal via structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are laterally offset (e.g., not stacked) via structures and methods for their construction. These structures may offer improved inter-level connection density relative to grid via fields. In some embodiments, about half the via structures may be populated in a first level of a semiconductor device, and the remaining via structures may be populated in a second level of a semiconductor device. The via structures on each level of the device may be arranged so that any three laterally adjacent vias includes one via from the first or second level (and two from the other level), so that if the vias are connected by a conductive structure joining adjacent vias, each via is connected, through the conductive structure, to at least two vias of another level. In some embodiments, the laterally offset vias may be disposed as a series of concentric hexagonal patterns, which may further optimize via structure density. The increased density may enable lower power and higher performance devices.

A semiconductor device, or other related device (e.g., an interposer) may comprise a plurality of levels, requiring various connections between those levels. For example, power and ground, (e.g., power deliver/distribution network (PDN) signals) may pass high currents through a device. Numerous signals (e.g., high bandwidth memory (HBM), assorted digital input/output signals (DIO), PCIe lanes, etc.) may also require a large number of pathways to pass between levels of a semiconductor or related device. For example, signals may pass between two silicon dies of a multi-die semiconductor device, when those dies are disposed on different levels of the semiconductor device.

Alternatively or in addition, a plurality of silicon dies disposed on a single level may pass signals through a plurality of levels of the semiconductor device due to routing constraints such as a lack of lateral space on the level the semiconductor dies are disposed within. Additionally, signals including power and ground signals may need to pass between various levels of a semiconductor device to connect a silicon die to a substrate, such as a printed circuit board (PCB). To pass high signal counts and/or high current, it may be advantageous to maximize the number and density of via structures joining multiple levels of a semiconductor device.

In some applications, such as for certain conductive structures disposed within a silicon, polymer, or FR4 body, via structures passing through a plurality of device levels may be disposed substantially overlapped along a z-axis (i.e., stacked) in order to minimize a path length, resistance, etc., as well as to increase device density. However, such an arrangement may be unsuitable with certain materials, applications, etc. For example, a plurality of stacked vias may undergo greater displacement under vibration or handling than a single via. Further, certain materials or processes may not be suitable for stacked via structures, for example, a manufacturing process may be inadequate to align the vias over along the z-axis. Thus, in some embodiments, laterally offset (e.g., laterally next to each other) via structures may be utilized in addition to or instead of stacked vias. In a laterally offset via pattern, a first via disposed in a first level of a device is connected to a second via disposed in a second level of a device by a conductive structure. The conductive structure may comprise power or ground planes that occupy all of or a substantial portion of a level or sub-level of the device disposed between the first and second via structures. Advantageously, such an embodiment may enable a connection of a plurality of vias in different levels of a device through the conductive structure, even where the lateral placement of the vias lacks precision. However, laterally offset vias may be limited by reduced density, relative to stacked vias, and thus it may be desirable to maximize via density of laterally offset vias to optimize (e.g., maximize) the number of connections between levels of a device. Patterns which are disclosed herein may enable such connections, which may optimize (e.g., minimize) transmission losses of PDNs.

In some applications, processes, or devices, power planes or other large metal deposits may exceed design rules. For example, excess metallization may not be achievable within a desired cycle time, such as with certain deposition practices. Further, such metallization may result in undesirable capacitance (which may, in turn, interfere with various power, data, or other signals). Further, large power planes may result in a delamination between dielectric layers of a device, such as under vibration, thermal cycling, etc., for certain combinations of dielectric and conductive materials. Within such design constraints, a connection structure comprising a plurality of via structures disposed within different device levels laterally joined by a conductive structure may be designed to optimize connection density, resistance, and signal integrity, in order to maximize connections and current joining levels of a device.

Repeating patterns of via structures (via fields) may be composed of many geometries. For example, some designs may comprise a large via field to join two levels of a semiconductor device, such as according to the particular geometry of the device, or according to an infinite plane. Other designs may focus on a local pattern, which, advantageously, may be of interest when connecting to a terminal connection such as a ball grid array (BGA) bump, controlled collapse chip connection (C4), etc. Beneficially, the use of a local pattern may enable design reuse of structures, such as by their incorporation in design libraries, which may, in turn, enable other process optimizations for them, and increase overall design confidence based on their cumulative use in many applications. Thus, it may be advantageous to create standard discrete patterns capable of re-use. Indeed, in some semiconductor devices, such "library structures" may be utilized over a custom design, even where a custom design may have apparent technical advantages.

In certain embodiments of a local pattern or a large scale via field, a majority of electrical current flow, thermal transfer, etc. may be between adjacent vias. For example, in a large Cartesian grid of via structures, the properties of the grid may be substantially modeled according to the immediate connections between adjacent via structures. Thus larger entities may be described by a sub-pattern. For example, in many via patterns, a sub pattern of a triangles may be present, from which properties of the larger pattern or field may be inferred.

FIG. 1 illustrates a pattern of two concentric hexagons. An (innermost) first hexagonal pattern 110 is depicted surrounded by a second concentric hexagonal pattern 120 of via structures having six via structures, 120a-f. The depicted hexagonal patterns is denser that a tetragonal or pentagonal pattern, having a similar distance between the via structure of the first pattern 110 and the via structures of the second pattern 120. Although the figures are not intended to depict any particular scale, for a fixed distance between concentric patterns, a heptagonal pattern, octagonal pattern, etc. may not maintain the via to via spacing in the second or subsequent levels, thus for some embodiments, the hexagonal pattern maximizes footprint density, and may thus also maximize the number of connections between levels of a semiconductor device through via structures populating the footprint.

The depicted structures are disposed along an X-Y plane, as indicated by the axis 199. The disposition of various elements thereupon may be referred to a lateral disposition. Such lateral disposition is without regard to a location along a z-axis. For example, the various via structures of the hexagonal pattern of FIG. 1 may be disposed in various levels of a device (i.e., distributed along a z-axis of the device). However, the lateral relationship between such devices describes only their position within X-Y planes. The via structures may comprise vias traversing between two levels of a semiconductor device, a through silicon/substrate vias (TSVs) traversing a silicon chip or otherwise substrate, Through-Interlayer-Via or Through-InFO-Via (TIV) traversing a plurality of levels of a semiconductor device, or other methods of electrically connecting various levels of a semiconductor device.

Any number of additional hexagonal or other patterns may surround the depicted embodiment, or otherwise be comprised within the depicted pattern. In some embodiments, the depicted pattern may be laterally surrounded by two additional concentric hexagonal patterns. Additional hexagonal patterns may be added, which may maintain similar spacing and include a difference of six via structures in each hexagonal pattern. For example, some embodiments include a third concentric hexagonal pattern of via structures having twelve via structures, and a fourth concentric hexagonal pattern of via structures having eighteen via structures, so that the hexagonal pattern includes thirty seven via structures. Further embodiments may comprise a fifth hexagonal pattern having twenty-four via structures, and so on, or may comprise larger, smaller, or different patterns.

Some embodiments may not populate every position within the pattern with a via structure. For example, via structure 120e may be left unpopulated (e.g., if the via would interfere with a keep-out zone), and the other six via structures may be populated. For the sake of clarity, the "footprint" describes a portion of the conductive structure configured to receive the via structure. The pattern may include a location of such a footprint within a regular pattern. In many embodiments a footprint to receive a via structure may be present at a pattern location, however, a pattern location does not require any such footprint or other tangible properties. For example, in one embodiment, an arbitrary pattern may comprise a pattern extending outside of a semiconductor device. Some pattern locations may comprise no footprint, no surrounding dielectric, etc. (i.e., may not exist in any tangible form whatsoever). For example, if via structure 120e was unpopulated, and the remaining depicted vias remained, such an embodiment may herein be referred to as a pattern comprising seven locations for via structures, with six such locations populated with respective footprints for via structures. A footprint may be populated along one or two, or more surfaces. For example, a stacked via may populate a footprint on two surface, whereas a laterally offset via may populate a footprint on one surface.

Figures 2A, 2B, 2C, 2D:
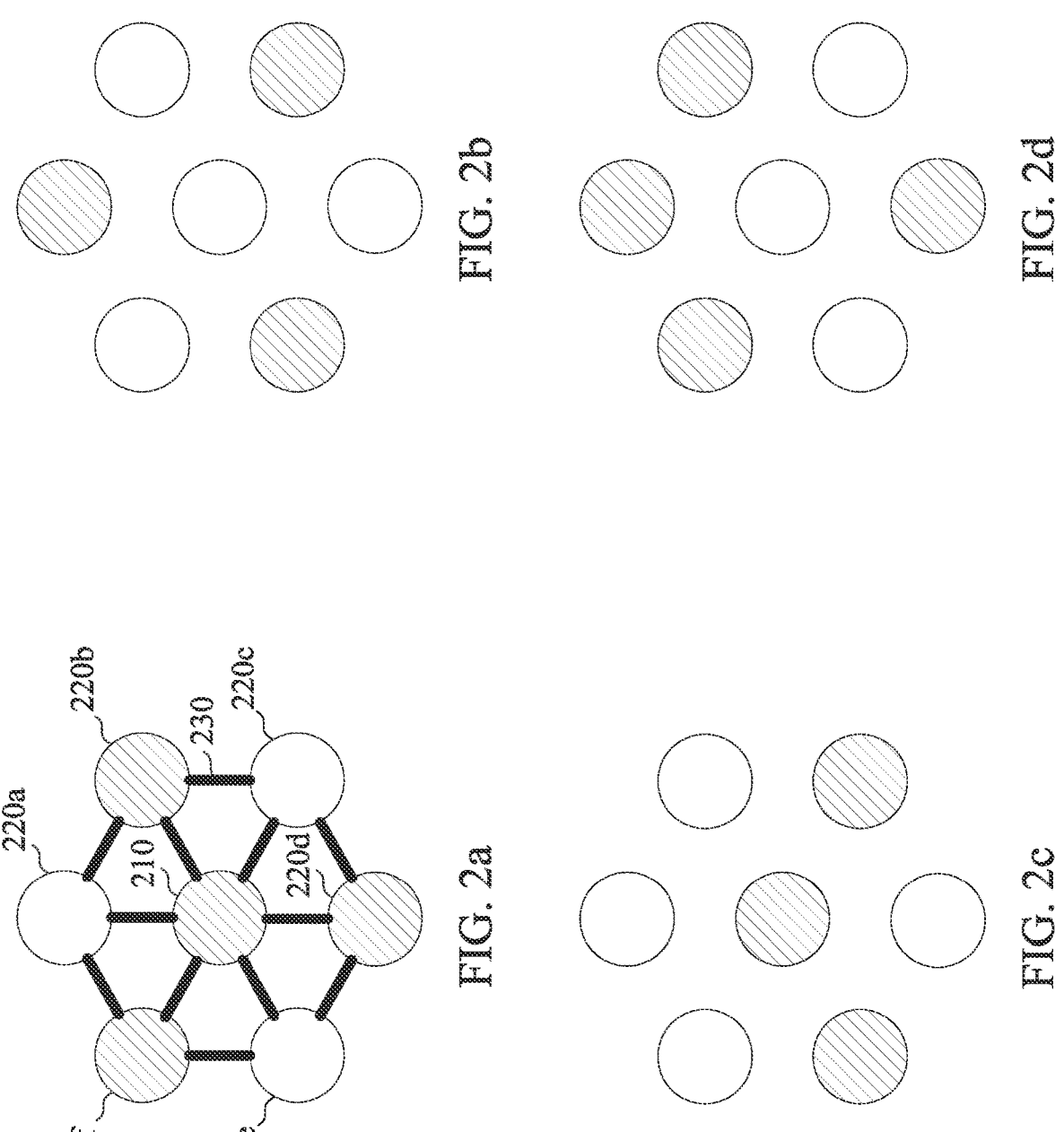
FIGS. 2a, 2b, 2c, and 2d illustrate a plurality of patterns for a concentric hexagonal connection structure having two concentric hexagons, in accordance with some embodiments.

Some embodiments include only a subset of footprints. For example, some embodiments may populate only an innermost footprint, leaving a substantial dielectric space between adjacent patterns (e.g., to avoid undesired capacitive coupling with adjacent patterns). Some connection structures populate about half of the footprints with a via structure in a first level of a device, and connect about half of the footprints with a via structure in a second level of the semiconductor device in order to maximize the connections between two levels of the semiconductor device. Such embodiments may, advantageously, maximize the potential connections between each of the levels of the device. Referring now to FIG. 2a, one illustrative example is disclosed.

The depicted pattern is comprised of two concentric hexagonal patterns, an innermost first pattern 210, and a second pattern 220 laterally surrounding the first pattern 210. The second concentric hexagonal pattern comprises a first plurality of footprints, 210, 220b, 220d, and 220f, as well as a second plurality of footprints, 220a, 220c, and 220e. The first plurality of footprints may be populated with via structures impregnated within a first level of a semiconductor device, and the second plurality of footprints may be populated with via structures impregnated within a second level of the semiconductor device (e.g., within a dielectric body). A conductive structure 230 joins the first plurality of via structures to the second plurality of via structures (e.g., electrically, thermally, mechanically, etc.). The conductive structure 230 comprises a plurality of footprints (not depicted) configured to receive via structures which are interconnected by conductive traces. The footprints may be larger in lateral size than the via structures, which, advantageously, may allow the footprints to receive vias which are misaligned with the footprints, and increase overall metallization in certain embodiments. Alternatively, or in addition, the conductive structure may comprise footprints which are smaller than the via structures which may minimize a metallization percentage in certain embodiments, or to allow for larger traces, (e.g., to reduce resistance). For example the footprints may be of the same dimension of the conductive traces they join. Some embodiments may comprise footprints about the same size as the vias they are configured to receive, which may balance the metal content of the footprints with the ability to receive slightly misaligned vias.

The conductive structure also comprises a plurality of connections between footprints and any connected via structures. For example, each depicted via structure of the first plurality of via structures is connected to at least two via structures of the second plurality of via structures. Subdivisions of the pattern may also be considered. For example, the triangular portion of FIG. 2a formed by the first pattern 210, and vias 220a, and 220b comprise two via structures from one level of the semiconductor device, and one via structure from another level of the semiconductor device. Further, the triangular portion comprises two inter-level connections (the depicted connection between the first pattern 210 and via structure 220a, and the depicted connection between via structure 220a and via structure 220b). Indeed, every triangular selection of the via structures of FIG. 2a has similar properties. The two inter-level connections of any such portion of the depicted pattern, in combination with the depicted conductive structure may, beneficially, maximize the connections between levels (e.g., minimize transmission losses) for power delivery, or delivery of various other signals, relative to other connection structures which may comprise fewer inter-level connections, or which may comprise less regularly repeating patterns (embodiments of which disadvantageously, may lead to hot spots, poor signal integrity, etc. in particular semiconductor devices and applications, but which may also have associated advantages).

FIG. 2b depicts a similar pattern as FIG. 2a, where the patterns for the via structures of the first level of the semiconductor device, and the second level of the semiconductor device are inverted. Because the first level and second level of the semiconductor device are intended to be arbitrary, without reference to the steps of various operations, or the disposition of the connection structure in free space, FIGS. 2a, and 2b may refer to the same pattern according to two different descriptions, or may refer to two different patterns. Although not depicted, a connection structure 230 of FIG. 2b may be similar to the connection structure 230 of FIG. 2a. Alternatively, the connection structure of FIG. 2a may vary from the depicted connection structure. For example, the various connections may be thinner or thicker (e.g., in a lateral direction, or along the z-plane), and may be of uniform dimension or non-uniform dimension. In one embodiment, a conductive trace may gradually taper to meet a larger conductive footprint (e.g., to avoid signal reflections, manufacturing issues such as over-etching, etc.).

FIGS. 2c and 2d refer to another paired set of descriptions of patterns which may refer to the same pattern according to two different descriptions, or may refer to two different patterns. Although alternate embodiments may exist, the depicted FIGS. 2a-2d are each configured to dispose about half of the via structures on separate levels of a device, and wherein any triangle of adjacent via structures comprises two inter-level connections. Thus every via structure is connected to a level of the semiconductor device by at least two traces. Some embodiments may be disposed within devices other than semiconductor device, for example, within various non-semiconductor interposers or substrates.

Referring now to FIG. 3, a plurality of concentric hexagonal patterns are considered, ranging from a single via pattern to a pattern of five concentric hexagons. Selected approximated attributes of each device are displayed in summary table 300. As shown in column one of the table

300, the single via has a relatively low density (about 1%), and a the via comprises most of the metal in the connective structure (about 90%), since only a single footprint and no traces are needed to receive the via. A connection structure, for example, the connective structure disclosed in FIG. 2a, disclosed by column two substantially increases density, though metallization increases non-linearly, to account for the addition of conductive traces needed to join the various vias. Via count is further increased with a third concentric hexagon, along with a coincident increase in metal density. Via count and metal density continue to increase with a fourth and fifth concentric hexagon.

If a maximum metal density of about 100% is desired, a pattern of five concentric hexagons may be selected. If a lower or higher metal density is desired, a different shape may be selected. For example, if a metal density between about 50% and 70% is desired, a pattern of four concentric hexagons may be selected. As one skilled in the art will understand, particular numbers will vary according to the size, composition, and geometry of via structures, footprints, traces, etc. Further, various design rules may affect the selected geometry. Thus although a structure of 4 concentric hexagonal patterns maximizes density for one embodiment, other geometries or design rules may result in patterns of different shapes, numbers of patterns, etc.

Figure 4A:
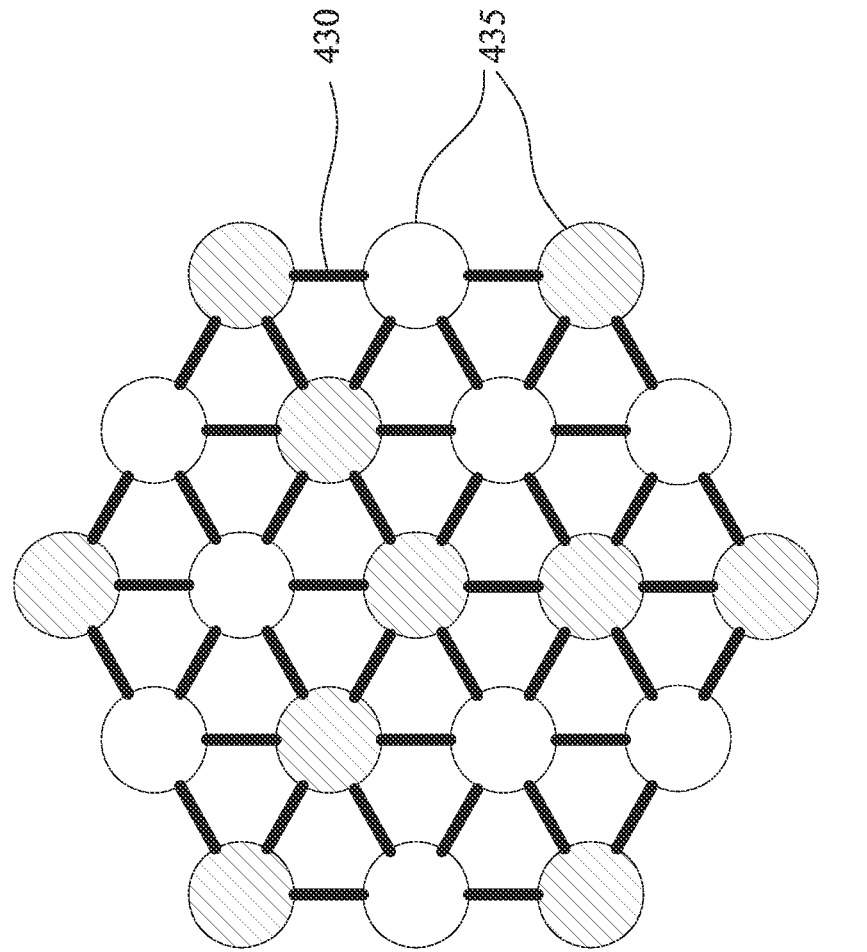
FIGS. 4a, 4b, 4c, 4d, 4e, and 4f illustrate a plurality of patterns for a concentric hexagonal connection structure having three concentric hexagons, in accordance with some embodiments.
Figures 4B, 4C, 4D, 4E, 4F:
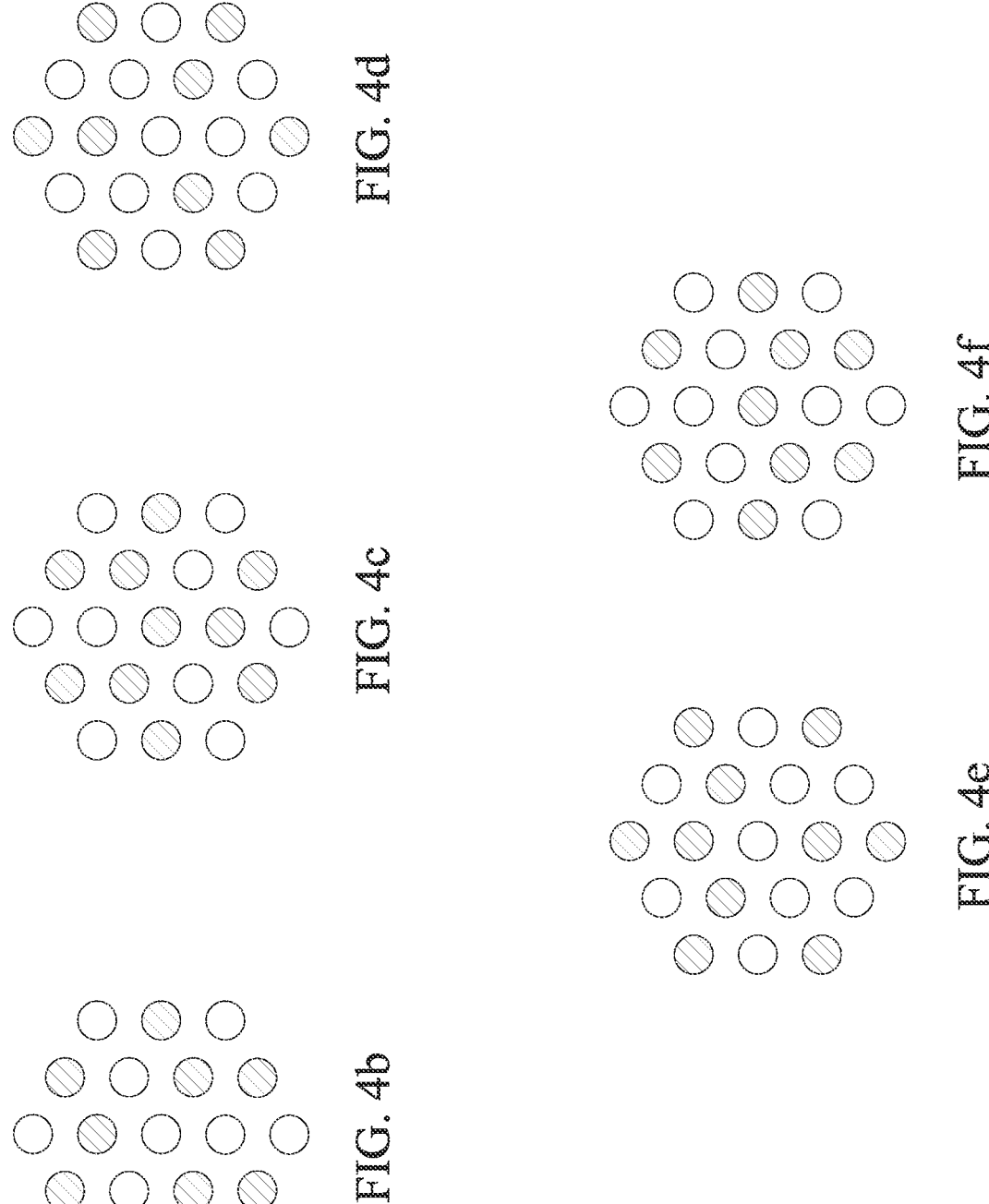
Figure 5A:
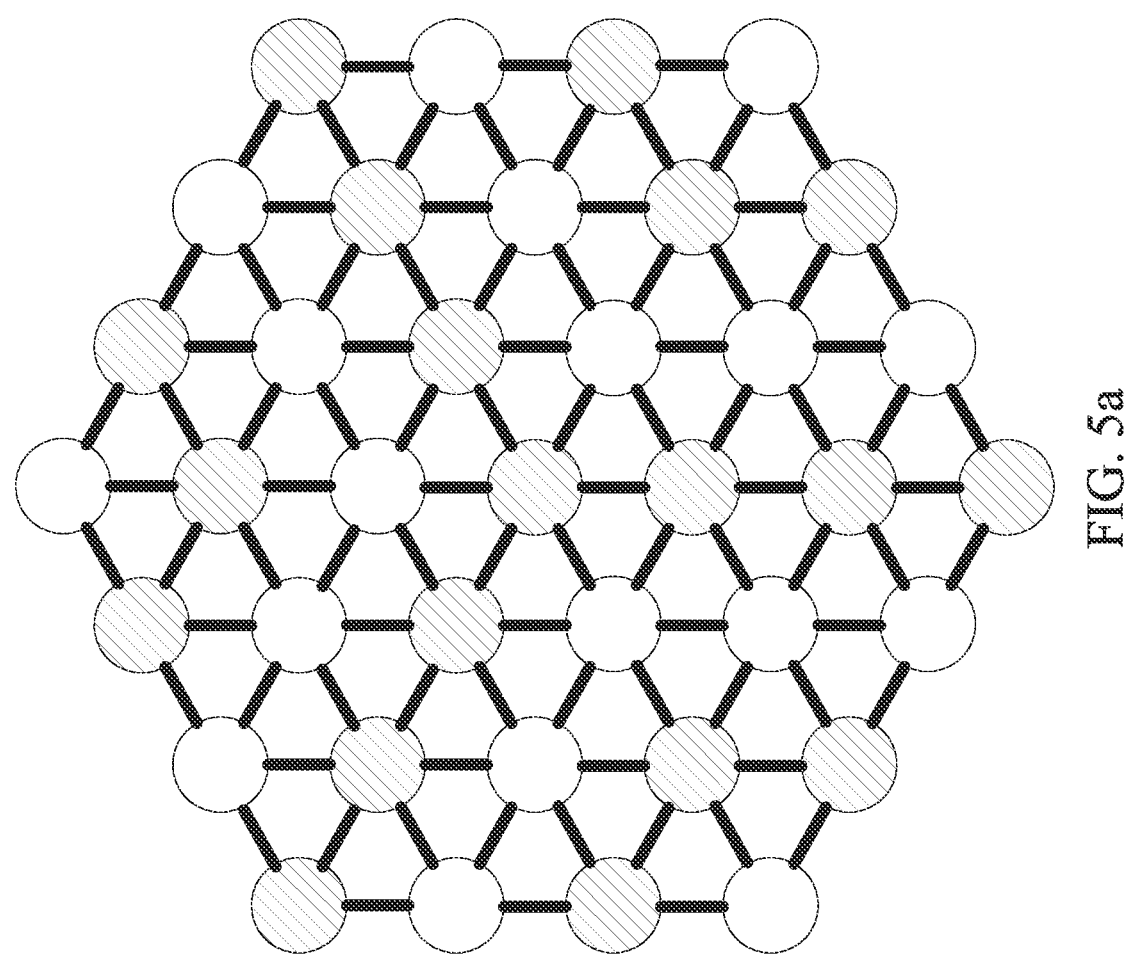

Referring now to FIGS. 4a-4f, a plurality of hexagonal patterns of three concentric hexagons is depicted. Like the patterns of FIGS. 2a-2b, the hexagonal patterns are disposed across two levels of a semiconductor device, with the plurality of first via structures disposed in the first level shown darkly shaded, and the plurality of second via structures disposed in the second level shown lightly shaded. Referring specifically to FIG. 4a, a disclosed pattern is similar to the pattern of FIG. 2a, comprising an additional third hexagonal pattern 435 of via structures. A connection structure 430 joins each of the via structures according to a similar pattern as FIG. 2a, where each via is connected to two vias of another level. Such a pattern may enable a maximum number of connections between levels of a semiconductor device, (e.g., adjacent layers where the via structures are convention via structures extending between two levels of a semiconductor device). Referring now to FIGS. 4b-4f, additional patterns are disclosed which may be populated with via structures, and joined with conductive structures, such as the conductive structure depicted in FIG. 4a, to form connection structures to join a maximum number of via structures between levels of a semiconductor device.

Referring now to FIGS. 5a-5h, a plurality of hexagonal patterns of four concentric hexagons is depicted. Like the patterns of FIGS. 4a-4f, the hexagonal patterns are disposed across two levels of a semiconductor device, with the plurality of first via structures disposed in the first level shown darkly shaded, and the plurality of second via structures disposed in the second level shown lightly shaded. The first and second pluralities of vias are shown connected by a conductive structure disposed between the first and second pluralities of via structures in FIG. 4a. Other connection structures may comprise similar conductive structures joining via structures. As illustrated, each concentric level of hexagons comprises an alternating pattern of via structures between levels of a semiconductor device, so that beginning with one via structure of a concentric hexagonal pattern, and advancing, clockwise or counter-clockwise, every other via will be disposed on the same level (except the first, innermost hexagon, having a single via structure).

Additional pluralities of via structures may be disposed on, along, or in additional semiconductor levels. For example, a third plurality of via structures may be disposed on a third level of the semiconductor device, and may connect to the plurality of second via structures through a second conductive structure. The third via structures may be similar to the first plurality of via structures, (and such an alternate repetition of levels may continue through a plurality of fourth, fifth, and sixth via structures) which may each be joined by a respective additional conductive structure. Alternatively, or in addition, some connection structures may extend through several levels of a semiconductor device without alternating between two patterns of populated footprints. For example, they may comprise additional patterns, such as those depicted by FIGS. 5b-5g, may comprise additional or fewer concentric hexagonal patterns, or may comprise different connections entirely, such as TSVs, bond wires, C4 bumps, etc. In some embodiments, less than half of the pattern locations of a concentric hexagonal pattern may be populated. For example, about a third, about a quarter may be populated. For example, if a plurality of levels each comprise a plurality of via structures, the pluralities extending above/below a power plane or redistribution level may contain fewer (or more) populated via structures. The unpopulated via structures may be distributed throughout the pattern, limited to particular (e.g., outermost) concentric patterns, or otherwise selected.

Figure 6:
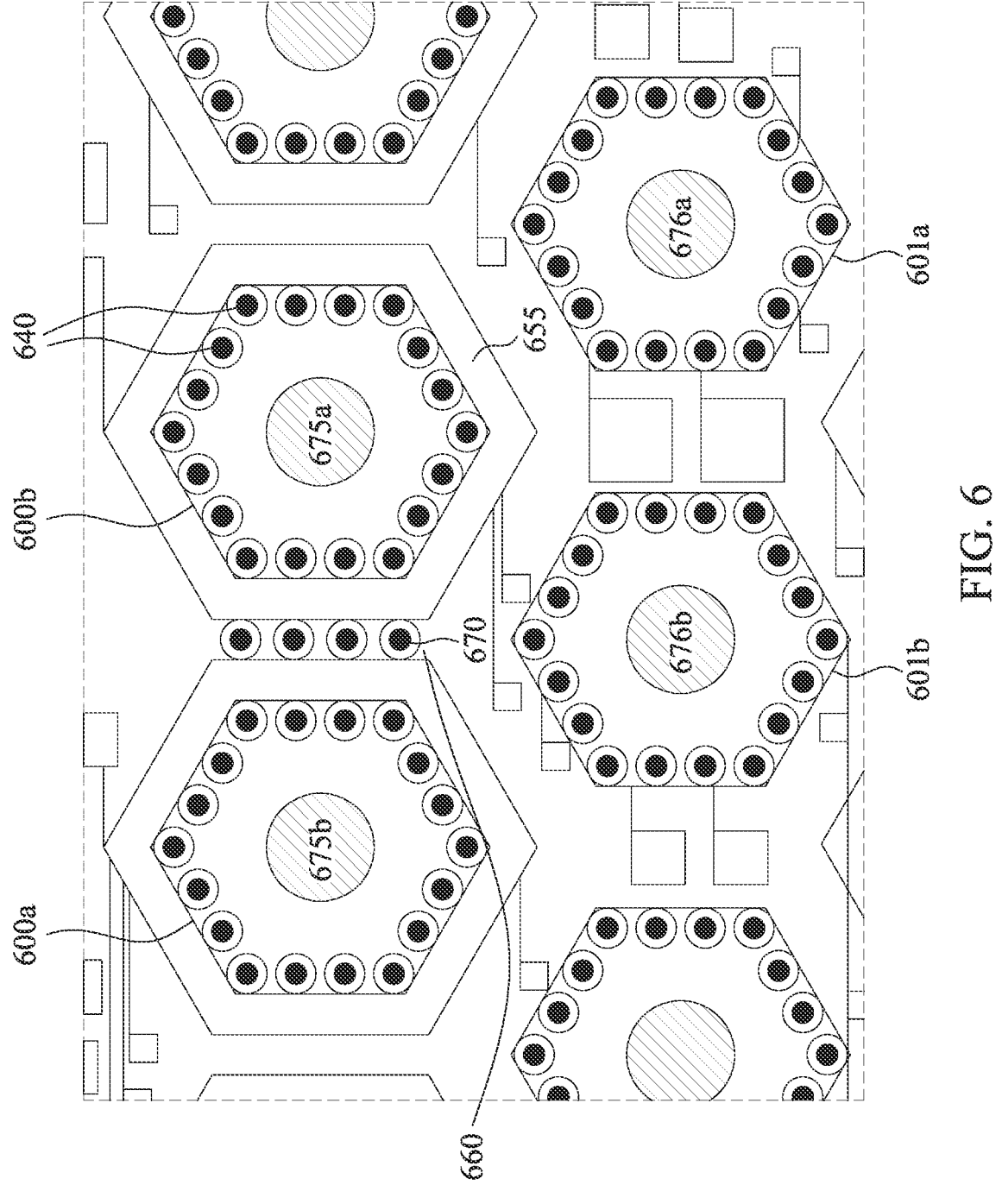
FIG. 6 illustrates a pair of laterally disposed patterns for a concentric hexagonal connection structures having four concentric hexagons.

Referring now to FIG. 6, a terminal portion for the various connective structures disclosed herein, and variants thereof, is disclosed. Depicted are a first and second VDD connection assembly, 600a, and 600b, and a first and second VSS connection assembly, 601a and 601b. Connection assemblies may comprise various terminals, for example, a first VDD connection terminal 675a, which may be, for example a, terminal pad, lead, pin, etc., to supply voltage to a semiconductor device in addition to the depicted BGA ball. The first VDD connection terminal 675a may connect directly to the via structures of a connection structure, or through intermediate conductive element such as an under-ball metallurgy pattern (UBM), a plane, or another conductive structure, which may be similar or dissimilar to the conductive structures in other levels of the connective structure. The depicted embodiment includes a pattern containing only a fourth concentric hexagonal pattern 640, connected to a plane which, in turn, connects to a BGA ball.

A guard trace 655 surrounds the connection structure from other elements disposed along the depicted level of the semiconductor device. The guard trace may comprises a dielectric which may be a polymer such as polybenzoxazole (PBO), polyimide, BCB, or the like; a nitride such as silicon nitride or the like; an oxide such as silicon oxide, Phospho-Silicate Glass (PSG), BoroSilicate Glass (BSG), Boron-doped PhosphoSilicate Glass (BPSG), or the like. In some embodiments, the guard trace 655 extends to additional semiconductor levels, such as all or a portion of the levels comprising the connection structure. The guard trace may protect adjacent traces, planes, etc. from interference from the VDD supply voltage (e.g., interference from ripple or large currents, capacitive coupling to conductive elements of the connection structure, etc.). In the depicted embodiment, a ground plane surrounds the first VDD connection terminal 675a.

A second VDD connection terminal 675b of connection assembly 600b is depicted laterally spaced from the first VDD connection terminal 675a, and having similar elements thereto. A bridge portion 660 of the ground plane is disposed between the VDD connection assemblies 600, and comprises a plurality of via structures 670. The via structures may join the bridge portion 660 of the ground plane to a redistribution structure disposed in another level of the semiconductor device, to another ground plane, a trace, a silicon die, etc. Additional levels of the semiconductor device may also comprise via structures, which may, advantageously, shield the VDD signal from other signals of the semiconductor device (and vice versa), ensure a return path for high frequency signals, etc. Some embodiments may forego such shielding via structures entirely, or include additional structures (e.g., laterally surrounding the connection structures). For example, some embodiments may not include a bridge portion 660 of a ground (or other) plane, which may, advantageously, enable the VDD connection assemblies 600 to be closer, to increase overall device density. For example, if the VDD connection assemblies 600 have a pitch of 153 μm, an embodiment which forgoes the bridge portion 660 in favor of increased VDD connection assembly 600 density may enable a pitch of about 130 μm. One skilled in the art will understand that these particular measurements are not limiting and will vary according the various pattern geometries, via structure and footprint sizes, desired isolation, etc.

The first 601*a* and second VSS connection assembly 601*b* include similar elements. For example, a pair of VSS terminal connections 676*a*, 676*b* are depicted, which may be of similar or different construction than the VDD terminals (e.g., may be a ground pad, BGA ball, etc.). Like the VDD connection terminals 675, the VSS terminal connections 676 may comprise a plurality of terminal connections rather than the depicted BGA ball. For example, in one embodiment, comprised of four concentric hexagonal patterns, comprising 37 footprints, 18 terminal connections are attached to the VSS connection assemblies 601. Conversely, in some embodiments, less than one terminal connection per connection structure may be attached. For example, a pad (e.g., a ground pad) may be connected to a plurality of connection structures, or at least one connection structure may not be connected to a terminal connection (e.g., may be bussed with other connection structures, left electrically floating, etc.)

Figures 7A, 7B, 7C:
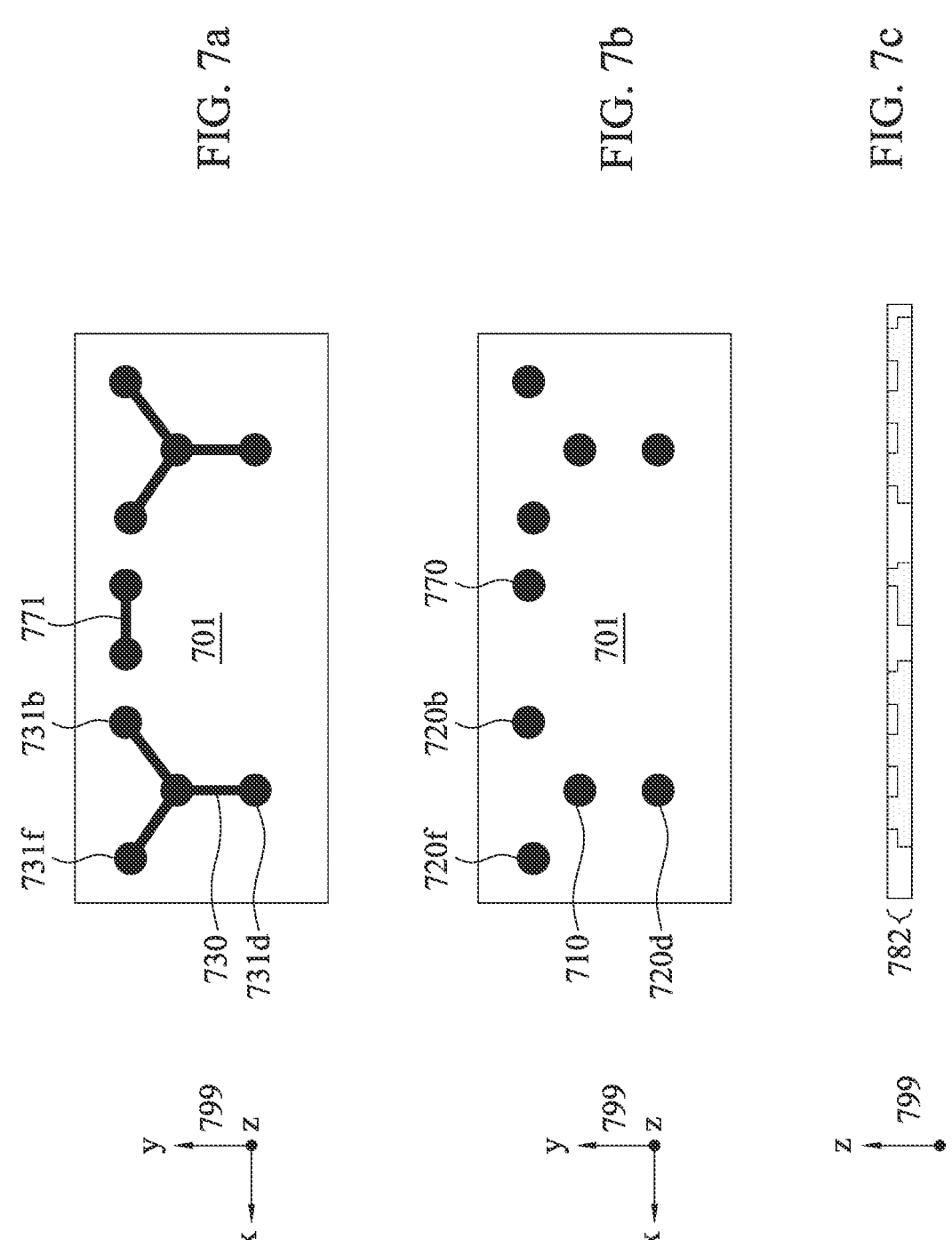

Referring now to FIGS. 7*a*-7*f*, a method for manufacturing a semiconductor device is disclosed. FIG. 7*a* depicts a top down view (i.e., an x-y axis 799 cross section, viewing the device from the positive z-axis 799) dielectric body 701 which may comprise various oxides, nitrides, and/or polymers, and may be placed, formed in situ by any combination of additive and substantive processes (e.g., by a deposition process over a glass or ceramic carrier substrate configured to be later de-bonded), etc. The dielectric may be a high-k, low-k, or conventional (e.g., silicon dioxide) dielectric. The dielectric body 701 may be formed by a process such as molding, spin coating, chemical vapor deposition (CVD), physical vapor deposition (PVD), or other processes known to those skilled in the art. A plurality of conductive structures, including a first conductive structure 730 comprising a plurality of footprints 731*b*, 731*d*, 731*f* configured to receive via structures, and connected by conductive traces is formed. The conductive structures may be formed by creating voids within the dielectric body to receive metal, such as with a photoresist and mask or laser ablations, and then placing metal (e.g., by pouring, deposition over a seed layer, etc.) in the voids. If excess metal is be deposited, it may be removed by a polishing/planarization process, such as chemical mechanical grinding, (CMG), chemical mechanical polishing/planarization (CMP), etc.

Referring now to FIG. 7*b*, another top down view (i.e., an x-y axis 799 cross section, viewing the device from the positive z-axis 799) is disclosed. This view is disposed above (e.g., in the positive z-direction) the previous view, within the same level of the semiconductor device. The dielectric body is expanded by similar or dissimilar processes as above, depositing additional dielectric material, and a plurality of via structures may be connected to the conductive structure 730 of FIG. 6*a*. An adjacent structure, similar structure a ground via 770 disposed between the conductive structures is also depicted, the ground via 770 being joined to a conductive ground pad. The order of the described operations is not intended to be limiting. Various operations can be completed in any sequence. For example, the vias may be formed and placed over the footprints prior to the expansion of the dielectric body. Indeed, the vias and electric structure may be joined prior to the introduction of any dielectric, which may then be formed over the footprints and via structures (in a single operation, or in multiple operations; of a single material, or of a plurality of materials).

FIG. 7*c* depicts a profile view of a first level 782 of a semiconductor device comprising the via structures, and dielectric body of FIG. 7*b*, as well as the connection structures, and dielectric body of FIG. 7*a*. FIG. 7*d* shows an addition of a second level 784, third level 786, and fourth level 788 of a semiconductor device, which may be formed upon the first level, or according to another process or sequence. The naming convention of these levels (first, second, third, etc.) is intended only to clearly describe the embodiment depicted herein and is not intended to be limiting. Indeed, many levels of semiconductor devices may be referred to according to a reverse nomenclature (i.e., an ascending numbering while traversing the z-axis 799 in a negative direction). Although the various via structures and corresponding footprints of each level of the semiconductor device may be of any pattern, the depicted via structures alternate according to the pattern disclosed in FIG. 2*a*. The depicted embodiment does not comprise intermediate levels such as a silicon die level, a redistribution structure level, etc. However, various intermediate levels may be present in alternate embodiments. As discussed above, different via structures or connection methods may connect the patterns through such levels, including redistribution traces, conventional vias, bond wires, TIVs, etc.

FIG. 7*e* depicts a plurality of semiconductor chips (e.g., silicon chips) disposed over the plurality of levels of FIG. 7*d*. The semiconductor chips may be placed over the plurality of levels by a pick and place machine, by placing the plurality of levels over the semiconductor chips 792, or by another method. The semiconductor chips 792 may be electrically joined to the connective structures by solder balls, a solder mask, a die paste or other adhesive, or other methods known to those skilled in the art. In some embodiments, the semiconductor chip 792 may be placed on an intermediate substrate, such as a glass substrate which may thereafter be removed, such as by exposing an adhesive of the de-bonding layer to an appropriate energy source, such as ultra-violet light. In some embodiments, such as a flip-chip embodiment, the die may be adhered to the connective structure by C4 balls, or other intermediate connections not depicted in FIG. 7*e*. The lack of such depiction is not intended to be limiting, and is merely intended to clearly illustrate other elements of the semiconductor device. In some embodiments, the semiconductor chip 792 may electrically connect to other elements of the semiconductor device through another surface, such as a surface opposite the depicted surface. In such an embodiment, the connective structures may further comprise TIVs, or additional conventional vias to pass through additional levels of the semiconductor device to connect to one or more semiconductor dies 792 along another surface.

A protectant, thermal solder, or other encapsulant 794 (e.g., comprising resins, polymers, other molding compounds, etc.) may be formed over the semiconductor chips to encapsulate them. In some embodiments, such as the depicted embodiment, the encapsulant 794 may cover a surface of the semiconductor device opposite from the connective structures. Beneficially, such an embodiment may protect the semiconductor device from mechanical shocks, vibration, etc., and may thus be left in place. Alternatively, an upper portion of the encapsulant 794 (and, in some embodiments, an upper portion of the silicon die) may be removed by any suitable process (e.g., polishing, cutting, grinding, etc.), which may, enable improved thermal transfer along an upper surface of the semiconductor chips.

FIG. 7f depicts terminal conductors joined to the semiconductor device. The depicted semiconductor device comprises a plurality of intermediate connections 796, which may be, for example, the UBM patterns discussed above, a via, plane, or another intermediate connector 796. The intermediate connector 796 is joined to a terminal connector 798 such as a BGA ball. The depicted embodiment illustrates a BGA ball connected to each of footprints 731b, 731d, and 731f. The innermost footprints may also be connected to a BGA ball or other conductive terminal, though such a connection is not depicted in the profile view of FIG. 7e. As discussed above, in other embodiments, a plurality of footprints may be connected to a plurality of devices, or may be unconnected to a terminal device.

FIG. 8 includes a flowchart of a method 800 of fabricating a semiconductor device, in accordance with some embodiments. For example, at least some of the operations described in the method 800 may result in the semiconductor devices depicted in FIGS. 7a-7f. The disclosed method 800 is disclosed as a non-limiting example, and additional operations may be provided before, during, and after the method 800 of FIG. 8. Further, some operations may only be described briefly herein, however, one skilled in the art will understand that the disclosed operations may be performed in conjunction with other disclosed methods disclosed herein, or generally known in the art. For example, one skilled in the art will understand that the semiconductor device may be connected to an intermediate substrate, and that an under-fill be inserted between the semiconductor device and the intermediate substrate, such that the intermediate substrate may be configured to be attached to a PCB, absent any explicit disclosure. Further, the order of the disclosed operations is not intended to be limiting; certain operations may be performed in a different sequence, and still further operations may be sequenced with appropriate modifications thereto.

The method 800 starts with operation 802, wherein a first conductive structure is formed within a dielectric material of a semiconductor device. The method 800 proceeds to operation 804 wherein a first plurality of via structures are formed over the first conductive structure. At operation 806, additional levels of conductive structures as via structures are formed. Operation 808 comprises attaching a plurality of semiconductor chips to a first side of the conductive structure. At operation 810, a plurality of bump structures are attached to a second side of the connection structure, opposite the first side.

The method 800 starts with operation 802 wherein a dielectric material is impregnated with a conductive structure. The conductive structure may comprise footprints configured to receive via structures, and conductive traces to join the footprints. The conductive structure may be formed of any conducive material(s) (e.g., copper aluminum, graphene, doped silicon, etc.). The conductive structures may be formed within a dielectric body, or a dielectric body may be formed around the conductive structure. Various geometries of dielectric structures may be formed, for example, a grid, or a pattern of a plurality of concentric hexagons. Via structures may be formed at any number of pattern locations. In some embodiments, about half the pattern locations are populated on this level, and the populated pattern locations are selected, in conjunction with the pattern locations of an adjacent level, to ensure that each via structure received onto a footprint is connected to at least two vias on at least one level (i.e., contains two connection paths).

Referring to operation 804, via structures are formed over the footprints. Formed over comprises operations growing the via structures in situ, placing the via structures, etc., and may be completed during, before, or after the footprints are formed. In some embodiments, receiving the via structures may comprise the use of an intermediate joining layer, such as a bump, solder paste, etc. In some embodiments, the via metallization layer may be formed directly over the footprints. For example, the via structures may be of similar dimension and material as the pad, and may even be formed using the same or a similar process. For example, a deposition, or pouring process may be used. As discussed above, any excess conductive material may be removed during operation 804, or thereafter. If a dielectric material is not already present, a dielectric material may be deposited (e.g., by a molding or PVD process, etc.) after the via structures are formed. Conversely, a portion of the dielectric material may be removed prior to the addition of the metal (e.g., to form voids for the deposition of the metal).

Referring to now to operation 806, additional levels may be disposed over the first level. In some embodiments, this operation may comprise the addition of several levels, in other embodiments, this operation may be omitted (i.e., may consist of adding zero desired additional levels). Additional levels may be formed by similar or dissimilar methods and materials of manufacture. For example, a conductive structure of one level may be selected to minimize electrical resistance and may be copper, an additional layer may comprise an aluminum structure (e.g., to minimize weight). In another conductive layer (i.e., a layer to be exposed to air) gold may be selected to minimize corrosion. Various alloys, coating, etc. may combine a plurality of materials in portions of the connection structure (e.g., conductive structures, portions of conductive structures, via structure, etc.). Further, various dielectric materials may be selected to increase thermal conduction, control characteristic impedance of signal transmissions, (e.g., for a plurality of via structures configured to carry high frequency signals), according to cost, reliability, or manufacturability concerns, etc.

At operation 808, a plurality of semiconductor devices are attached to a first side of the connection structure formed in operations 802, 804, and 806. In some embodiments, the various levels of the semiconductor device may be formed over the semiconductor chips (e.g., the operations may be completed in reverse numerical order). Advantageously, this may minimize processing and movement of the semiconductor chips. In some embodiments, an intermediate level may be formed. For example, a fan-out structure may be interposed between the semiconductor chips and the layers formed in operation 802, 804, and 806. Alternatively, or in addition, the connective structure formed in operations 802, 804, and 806 may be a fan out level. Further, some embodiments may comprise a plurality of semiconductor chips disposed at a plurality of levels of a semiconductor device (e.g., a package on package device) and thus operation 808 may be completed during operation 806.

At operation 810, a plurality of bumps are attached to a second side of the connection structure opposite the first side. The bumps may be configured to attach the semiconductor to a substrate such as a PCB or intermediate substrate. Some embodiments may comprise bumps intended to attach to additional intermediate connectors, such as to an pin-grid-array pin, UBM, etc. Additionally or alternatively, some embodiments may comprise pads, leads, bond wires, etc.

Thus, by the selection of appropriate patterns, a maximum number of signals including power delivery network signals may be passed through a device encouraging device density design reuse, etc. For example, the selection of a pattern of four concentric hexagonal patterns totaling 37 vias may be selected, and a plurality of vias may be connected to such a pattern according to a pattern guaranteeing that every via structure connects to vias disposed in another level, which may increase the connections and current flow between device levels, relative to other patterns, such as grid via fields, and may thus enable better thermal management, lower loss PDNs, high current deliver, etc. in order to realize higher device performance and/or lower device power.

In one aspect of the present disclosure, a first pattern of a semiconductor device is surrounded by a dielectric in electrical contact with a first plurality of via structures disposed in a first level of the semiconductor device, and a second plurality of via structures in a second level of the semiconductor device. The plurality of via structures are laterally offset from each other such that no via structures are stacked, and every via structure is connected to at least two vias on at least one level of the semiconductor device.

In another embodiment, a connection structure includes a conductive structure electrically connected to a plurality of first via structures on one side, and a plurality of second via structures along a second side, whereas each plurality of via structures is a plurality of four concentric hexagonal patterns.

In yet another embodiment, a method for fabricating a semiconductor device is disclosed. The method includes forming a connection structure having a conductive structure disposed between and in electrical contact with pluralities of first and second via structures, and wherein each of the first and second via structures are laterally offset from reach other. A plurality of semiconductor chips are attached to one side of the connection structure, and a plurality of bumps are attached to an opposite side of the connection structure.

As used herein, the terms "about" and "approximately" generally mean plus or minus 10% of the stated value. For example, about 0.5 would include 0.45 and 0.55, about 10 would include 9 to 11, about 1000 would include 900 to 1100. On skilled in the part will understand that is some cases, about must be otherwise defined. For example, populating "about" half of a pattern comprising seven footprints slightly exceeds a 10% variance from 50%, but is still understood to be "about" half. For similar reasons, two may be "about" half of three where the three cannot practicably be fractionally divided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first conductive structure comprising:
      a first plurality of conductive traces impregnated along a first shared plane of a first level of a connection structure;
      a second plurality of conductive traces impregnated along a second shared plane of a second level of the connection structure;
      a plurality of first via structures disposed below and in electrical contact with the first level of the first conductive structure; and
      a plurality of second via structures disposed above and in electrical contact with the first level of the first conductive structure;
   wherein:
      each of the plurality of first via structures is laterally offset from any portion of any of the plurality of second via structures,
      two of the first plurality of conductive traces connect each of the plurality of first via structures to two of the plurality of second via structures,
      the plurality of second via structures extend between the first level and the second level; and
      the plurality of first via structures and the plurality of second via structures are arranged in hexagonal patterns, wherein an innermost one of the hexagonal patterns laterally surrounds an innermost one via structure and has six via structures, and wherein each hexagonal pattern has a difference of six via structures from any concentrically adjacent hexagonal pattern.

2. The semiconductor device of claim 1, wherein a number of concentric hexagonal patterns surrounding the innermost one via structure is three.

3. The semiconductor device of claim 1, wherein each of the concentric hexagonal patterns, has at least a first footprint for a corresponding one of the plurality of first via structures and at least a second footprint for a corresponding one of the plurality of second via structures.

4. The semiconductor device of claim 3, wherein at least the first footprint and at least the second footprint are laterally next to each other.

5. The semiconductor device of claim 1, wherein the connection structure is impregnated in a polymer body.

6. The semiconductor device of claim 5, wherein the polymer body comprises a high-k dielectric.

7. The semiconductor device of claim 1, further comprising:
   a third plurality of conductive traces impregnated in a third shared plane of a third level of the connection structure; and
   a plurality of third via structures disposed above and in electrical contact with the second level of the first conductive structure, wherein the plurality of second via structures extend between the second level and the third level.

8. The semiconductor device of claim 1, further comprising:
   a third conductive structure impregnated in the first level of the connection structure; and a fourth conductive structure impregnated m the first level
of the connection structure, wherein:

the first conductive structure Is configured to deliver a
first supply voltage, while the third and fourth con-
ductive structures are configured to deliver a second
supply voltage, and the first conductive structure includes a bridge portion
extending between the third and fourth conductive
structures.

9. The semiconductor device of claim 8, further compris-
ing a plurality of third via structures disposed within the
bridge portion.

10. A connection structure, comprising:

a plurality of first via structures arranged in one or more
first ones of a plurality of concentric hexagonal pat-
terns;

a plurality of second via structures arranged in one or
more second ones of the plurality of concentric hex-
agonal patterns;

and a first conductive structure, comprising a plurality of
conductive traces disposed along a shared plane, inter-
posed between and in electrical contact with the plu-
rality of first via structures and the second plurality of
second via structures; and wherein:

each of the plurality of first via structures is laterally offset
from any portion of the plurality of second via struc-
ture, and the plurality of conductive traces along the shared plane
electrically couple each of the first via structures to two
of the second via structures, and each of the second via
structures to two of the first via structures.

11. The connection structure of claim 10 wherein the
plurality of concentric hexagonal patterns comprise:

the first via structures at a first subset of footprints
comprising vertices of the hexagons; and a second subset of via structures at a second subset of the
footprints, complementary to the first subset.

12. The connection structure of claim 10 wherein each of
the plurality of first via structures has a respective connec-
tion path to each of two of the plurality of second via
structures.

13. The connection structure of claim 10 wherein the first
conductive structure, the plurality of first via structures, and
the plurality of second via structures form, at least in part, a
power delivery network.

14. The connection structure of claim 10 wherein the
connection structure is disposed within a dielectric body
comprising a polymer.

15. A semiconductor device, comprising:

a connection structure comprising:

a first conductive structure comprising a first plurality
of conductive traces impregnated along a same plane
of a first level;

a plurality of first via structures disposed below and in
electrical contact with the first conductive structure;
and a plurality of second via structures disposed above and
in electrical contact with the first conductive struc-
ture and extending to a second level of the conduc-
tive structure comprising a second plurality of con-
ductive traces electrically coupling the second via
structures with third via structures;

wherein each of the plurality of first via structures is
laterally offset from any portion of any of the plurality
of second via structures, and two of the first plurality of
conductive traces connect each of the plurality of first
via structures to two of the plurality of second via
structures;

a plurality of semiconductor chips connected to a first side
of the connection structure; and a plurality of bump structures on a second, opposite side
of the connection structure, wherein the plurality of
first via structures and the plurality of second via
structures are arranged in hexagonal patterns, wherein
an innermost one of the hexagonal patterns laterally
surrounds an innermost one via structure and has six
via structures, and wherein each hexagonal pattern has
a difference of six via structures from any concentri-
cally adjacent hexagonal pattern.

16. The semiconductor device of claim 15, wherein a
number of concentric hexagonal patterns is three.

17. The semiconductor device of claim 15, further com-
prising a dielectric encapsulating a plurality of the first or the
second via structures.

18. The semiconductor device of claim 15, wherein the
connection structure further comprises a second conductive
structure impregnated in a second level of the semiconductor
device, disposed between the first conductive structure and
the bumps, electrically connected to the first conductive
structure through at least one of the plurality of first via
structures or the plurality of second via structures, and
connected to the bumps through a plurality of third via
structures.

* * * * *